(12) United States Patent
Landru et al.

(10) Patent No.: US 10,134,602 B2
(45) Date of Patent: Nov. 20, 2018

(54) PROCESS FOR SMOOTHING THE SURFACE OF A STRUCTURE

(71) Applicant: Soitec, Crolles (FR)

(72) Inventors: Didier Landru, Champ Pres Froges (FR); Oleg Kononchuk, Grenoble (FR); Carole David, Crolles (FR)

(73) Assignee: SOITEC, Crolles (FR)

( * ) Notice: Subject to any disclaimer, the term of this patent is extended or adjusted under 35 U.S.C. 154(b) by 0 days.

(21) Appl. No.: 15/403,505

(22) Filed: Jan. 11, 2017

(65) Prior Publication Data

US 2017/0207101 A1    Jul. 20, 2017

(30) Foreign Application Priority Data

Jan. 14, 2016 (FR) ...................... 16 50279

(51) Int. Cl.
 *H01L 21/00* (2006.01)
 *H01L 21/3105* (2006.01)
 *H01L 21/762* (2006.01)
 *H01L 21/324* (2006.01)

(52) U.S. Cl.
 CPC .... *H01L 21/31051* (2013.01); *H01L 21/7624* (2013.01); *H01L 21/324* (2013.01); *H01L 21/76254* (2013.01)

(58) Field of Classification Search
 CPC ......... H01L 21/76254; H01L 21/76243; H01L 21/324; H01L 21/76259
 See application file for complete search history.

(56) References Cited

U.S. PATENT DOCUMENTS

| 2002/0058387 A1* | 5/2002 | Ito ..................... H01L 21/76259 438/308 |
| 2002/0081824 A1* | 6/2002 | Dolan ............... H01L 21/76243 438/480 |
| 2004/0063298 A1* | 4/2004 | Aga .................. H01L 21/76254 438/406 |
| 2004/0171257 A1 | 9/2004 | Neyret et al. |
| 2006/0214257 A1* | 9/2006 | Ninomiya ......... H01L 21/26506 257/502 |
| 2014/0030877 A1 | 1/2014 | Landru et al. |
| 2014/0273405 A1 | 9/2014 | Liu et al. |

FOREIGN PATENT DOCUMENTS

WO    2014202866 A1    12/2014

OTHER PUBLICATIONS

Kononchuk et al., Novel trends in SOI technology for CMOS applications, Journal Solid State Phenomena, vol. 156-158 (2010) pp. 69-76. (abstract only).
European Search Report for European Application No. 17150008 dated May 30, 2017, 7 pages.

* cited by examiner

*Primary Examiner* — Jaehwan Oh
*Assistant Examiner* — John M Parker
(74) *Attorney, Agent, or Firm* — TraskBritt

(57) ABSTRACT

A process for smoothing a silicon-on-insulator structure comprising the exposure of a surface of the structure to an inert or reducing gas flow and to a high temperature during a heat treatment includes performing a first heat treatment step at a first temperature and under a first gas flow defined by a first flow rate, and performing a second heat treatment step at a second temperature lower than the first temperature and under a second gas flow defined by a second flow rate lower than the first flow rate.

18 Claims, 3 Drawing Sheets

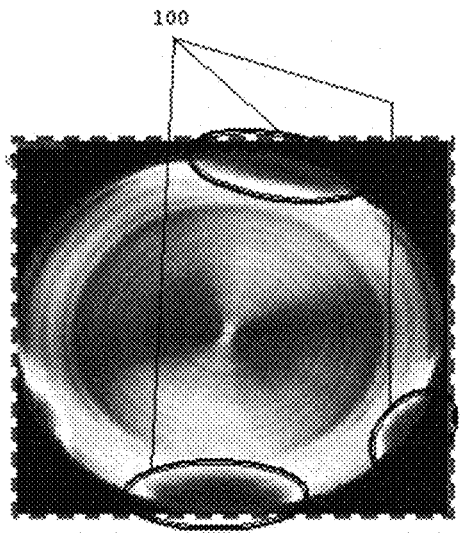
FIG.1 – Prior art
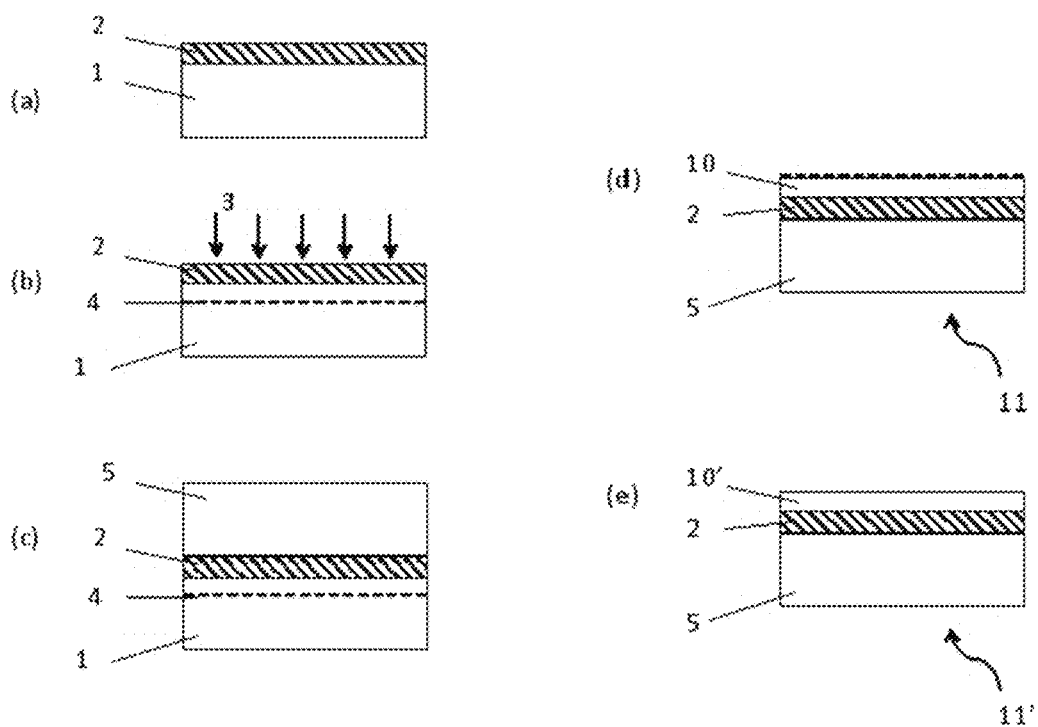
FIG.2 – Prior art

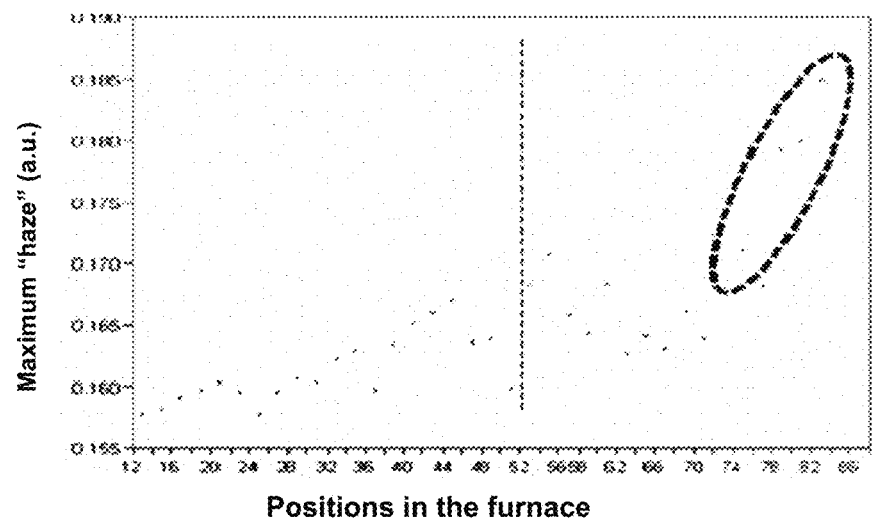
FIG.3 – Prior art
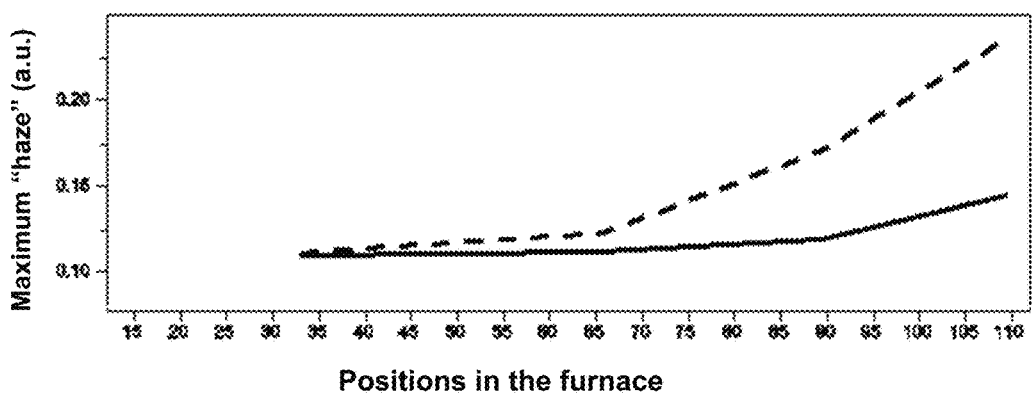
FIG.4

PROCESS FOR SMOOTHING THE SURFACE OF A STRUCTURE

PRIORITY CLAIM

This application claims the benefit of the filing date of French Patent Application Serial No. FR1650279, filed Jan. 14, 2016, for "Process for Smoothing the Surface of a Structure."

TECHNICAL FIELD

The present disclosure relates to a process for fabricating a structure successively comprising a useful semiconductor layer, a dielectric layer and a carrier substrate. More particularly, the present disclosure relates to a process for smoothing the surface of the useful layer. These structures are especially useful in the fields of microelectronics, micromechanics, photonics, etc.

BACKGROUND

Various processes allowing an intermediate structure, comprising in succession, a surface semiconductor layer, a dielectric layer, and a carrier substrate, to be formed are known from the prior art. It may, for example, involve a layer-transfer fabrication process (such as the processes known by the names SMART CUT® or ELTRAN™) or even the oxygen-implantation fabrication process (known by the acronym SIMOX: Separation by Implantation of Oxygen).

This intermediate structure, during a following finishing step, undergoes various treatments in order to convert the surface layer into a useful layer having all the expected properties especially in terms of average thickness, thickness uniformity, roughness, crystal quality, etc.

These known processes are especially employed for the fabrication of silicon-on-insulator (SOI) structures. In this case, the surface layer, which will become the useful layer, and the carrier typically consist of silicon and the dielectric layer of silicon dioxide.

These SOI structures must satisfy very precise specifications. This is especially the case for the final roughness of the useful layer and the thickness uniformities of the useful layer and of the underlying dielectric layer. Satisfaction of these specifications is required for the good operation of the semiconductor devices that will be formed in and on the useful layer.

Among the standard finishing treatments applied to an intermediate structure, smoothing annealing treatments that consist in exposing the surface layer to an inert or reducing atmosphere brought to a high temperature, typically above 1100° C., are known. This treatment, inter alia, allows, by surface reconstruction, the roughness of the layer exposed to the high-temperature atmosphere to be decreased.

These annealing operations may be carried out in furnaces suitable for treating a plurality of SOI structures simultaneously, under a controlled inert or reducing gas flow in order to promote the thermal homogeneity of the furnace. This gas is filtered in order to be extremely pure (less than 1 ppm of impurities) as any contaminant ($O_2$, $H_2O$, $CO_2$, etc.) capable of reacting with the silicon disrupts the surface smoothing. Imperfect smoothing is characterized by a degree of residual or non-uniform roughness at the surface of the useful layer.

Roughness measurements are generally carried out using an atomic force microscope (AFM). With this type of apparatus, the roughness is measured on surfaces scanned by the tip of the AFM microscope, ranging from $1\times1$ $\mu m^2$ to $10\times10$ $\mu m^2$ and less commonly $50\times50$ $\mu m^2$, or even $100\times100$ $\mu m^2$. It is also possible to measure the surface roughness by other methods, in particular by means of a "haze" measurement. This method has, in particular, the advantage of rapidly characterizing the uniformity of the roughness over the entire surface of the useful layer. This "haze," measured in ppm, is derived from a method that uses the optical reflectivity properties of the surface to be characterized, and corresponds to an optical signal scattered by the surface, owing to its microroughness. It is specified that the "haze" values that will be disclosed in this text are expressed in arbitrary units and were measured according to the same protocol and by the same device, in this case by an instrument of KLA Tencor SURF SCAN® SP type.

In the high temperature and annealing time ranges used for smoothing the surfaces of the SOI structures having a thin surface layer, a phenomenon of dissolution of the underlying oxide layer is capable of occurring. The dissolution phenomenon is in particular reported in the document "Novel trends in SOI technology for CMOS applications" by O. Kononchuk et al., that appeared in the journal *Solid State Phenomena*, volume 156-158 (2010) pp. 69 to 76. This document specifically explains that, in the high-temperature inert or reducing treatment atmosphere, the oxygen atoms of the dielectric layer are capable of diffusing through the surface layer and of reacting with the surface thereof in order to produce volatile species (gaseous silicon monoxide (SiO)), which are evacuated into the atmosphere of the furnace by the inert gas flow. This document also explains that for SOI structures having a thin surface layer, the diffusion of oxygen through the surface layer is limited by the ability to evacuate volatile species from the surface of the structure, and therefore that the extent of the dissolution phenomenon is locally linked to the gas velocity of the atmosphere of the furnace in the vicinity of the surface.

If the gaseous silicon monoxide (SiO) accumulates at the surface of the superficial layer during the heat treatment, it therefore locally slows down the dissolution, leading to differences in thickness of the surface layer and of the dielectric layer on the final product, which is particularly damaging. In order to limit the local accumulation of SiO it is necessary to maintain a high gas flow in the furnace, since the SiO is precisely evacuated via the inert or reducing gas flow circulating in the furnace.

The applicant has observed that, despite the controlled uniformity and purity of the gas flow in the furnace during a smoothing heat treatment at high temperature and under a high inert or reducing gas flow, certain SOI structures have "haze" levels greater than the expected level. This is in particular true at the edges of these structures, as illustrated in FIG. 1. Peripheral zones 100 of high residual roughness are present on the useful layer: they are shown on the "haze" mapping of FIG. 1 by darker zones, representative of a greater roughness (note that the central part of the mapping has darker regions in the form of butterfly wings, also known as "haze cross," which do not correspond to a greater roughness but to an artifact of the measurement method used). The peripheral zones 100 are a problem for the final product for which the surface roughness and its uniformity at the surface of the SOI structure are key parameters.

Thus, a smoothing annealing operation according to the prior art makes it possible to generally smooth the surface of the SOI structures, guaranteeing a good thickness uniformity of the final SOI structures (owing to a sufficient evacuation of the volatile species linked to the dissolution) but generates, on certain treated structures, peripheral zones 100 of residual roughness that are incompatible with the roughness specifications of the final product.

BRIEF SUMMARY

One objective of the present disclosure is therefore to propose a process that obviates the drawbacks of the prior art. One subject of the disclosure is in particular a process for smoothing the surface of a silicon-on-insulator structure that makes it possible to limit the appearance of peripheral zones of residual roughness, without degrading the thickness uniformity of the surface layer and of the buried dielectric.

The present disclosure relates to a process for smoothing a silicon-on-insulator structure comprising the exposure of a surface of the structure to an inert or reducing gas flow and to a high temperature during a heat treatment, the process comprising a first heat treatment step at a first temperature and under a first gas flow defined by a first flow rate. The process is noteworthy in that it also comprises a second heat treatment step at a second temperature lower than the first temperature and under a second gas flow defined by a second flow rate lower than the first flow rate.

The first step of the process enables the effective surface smoothing concurrently with a uniform dissolution phenomenon. During the second step of the process, a smoothing of the surface may also be carried out and may rectify the peripheral zones of residual roughness generated during the first step. The temperature conditions of the second heat treatment are such that the dissolution phenomenon is very slow or even non-existent, which makes it possible to reduce the gas flow and thus to limit the contaminants injected into the furnace that are capable of hampering the smoothing (in particular, by creating the peripheral zones of residual roughness). The second step of the process, therefore, makes it possible to improve the smoothing of the surface, in particular, at the peripheral zones, without degrading the thickness uniformity of the surface layer and of the buried dielectric.

According to advantageous features of the disclosure, taken alone or in combination:
- the process comprises a preliminary step of supplying the SOI structure comprising a thin surface layer positioned on a dielectric layer, the dielectric layer positioned on a carrier substrate, the surface layer having a thickness of less than 500 nm;
- the first temperature is greater than a threshold temperature and the second temperature is lower than the threshold temperature, which is between 1150° C. and 1170° C.;
- the first temperature is between 1160° C. and 1200° C., preferably between 1170° C. and 1200° C.;
- the second temperature is between 1130° C. and 1170° C., preferably between 1130° C. and 1160° C.;
- the second heat treatment step comprises a hold at the second temperature of a given duration;
- the duration of the hold is between 1 minute and 2 hours;
- the second heat treatment step comprises a temperature decrease ramp of between 0.1°/minute and 20°/minute, starting from the second temperature;
- the first flow rate is greater than 20 slm;
- the second flow rate is less than 15 slm;
- the inert gas is selected from argon or a mixture of argon and hydrogen;
- the first heat treatment step and second heat treatment step are linked together during the same heat treatment.

BRIEF DESCRIPTION OF THE DRAWINGS

Other features and advantages of the disclosure will emerge from the following detailed description of example embodiments of the invention with reference to the accompanying figures, in which:

FIG. 1 presents a "haze" mapping measured on the surface of an SOI structure comprising peripheral zones of residual roughness;

FIG. 2 presents steps of fabricating an SOI structure according to the SMART CUT® process;

FIG. 3 presents a graph with the maximum roughness level measured on each SOI structure after a smoothing process of the prior art;

FIG. 4 presents a graph with the maximum roughness level measured on each SOI structure after a smoothing process according to the present disclosure;

DETAILED DESCRIPTION

Figure 5:
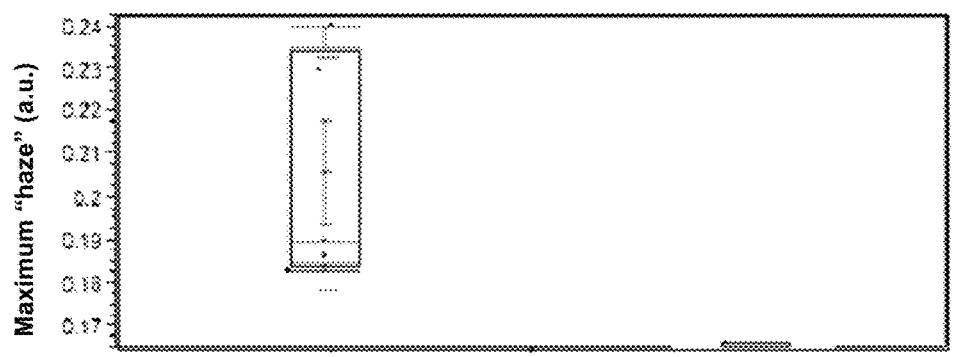
FIG. 5 presents a graph with the maximum roughness level measured on each SOI structure after a smoothing process according to the present disclosure.

FIG. 2 presents steps of fabricating a silicon-on-insulator (SOI) structure 11' according to one embodiment of the SMART CUT® process. A silicon donor substrate 1 undergoes a thermal oxidation step (FIG. 2, Panel (a)) in order to make the future buried dielectric layer 2 of the SOI structure increase in size. The thickness of the oxide could, for example, vary between several nanometers and several hundreds of nanometers. The donor substrate 1 is then implanted with light ions 3 (FIG. 2, Panel (b)). By way of example, a co-implantation of helium ($1e^{16}/cm^2$) and of hydrogen ($1e^{16}/cm^2$) could be carried out at an energy suitable for the desired thickness of the future silicon surface layer. This implantation step forms a buried fragile plane 4 in the donor substrate 1. The implanted donor substrate 1 is then assembled with a carrier substrate 5, for example, by bonding by molecular adhesion (FIG. 2, Panel (c)). A detachment annealing operation, for example, in the temperature range 350° C.-600° C., then makes it possible to make cavities in the buried fragile plane 4 increase in size in order to give rise to the separation of the donor substrate 1 at this plane 4. An intermediate SOI structure 11 is then formed (FIG. 2, Panel (d)). The intermediate SOI structure 11 comprises a surface layer 10 resulting from the donor substrate 1, positioned on the dielectric layer 2, the dielectric layer 2 assembled to the carrier substrate 5. At this stage, the surface of the surface layer 10 is rough (for example, of the order of 3 to 10 nm RMS-AFM measurement). In order for this surface layer 10 to be compatible with microelectronic applications, it is necessary to reduce its roughness, uniformly over the entire surface of the SOI structure, to a value of about 0.05 to 0.5 nm RMS (AFM measurement).

For this, various treatments may be carried out, in particular steps of sacrificial oxidation and of chemical mechanical polishing. It nevertheless appears that, for thin surface layers 10 (for example, having a thickness of less than 500 nm, or even less than 300 nm), the thickness uniformity of which on the substrate is critical (typically PV (peak-to-valley)<3 nm), the polishing, although effective for reducing the roughness, suffers from too high a non-uniformity of removal to be compatible with the specifications of the final SOI structures 11'.

It is, therefore, particularly advantageous to apply smoothing heat treatments that make it possible to obtain a greater final thickness uniformity of the useful layer 10' (FIG. 2, Panel (e)).

During these smoothing heat treatments, the surface of an intermediate SOI structure 11 is exposed to an inert or reducing gas flow, at a temperature typically above 1100° C. Under these conditions, the surface mobility of the silicon atoms is high and leads to a smoothing of the surface of the exposed surface layer 10. The higher the temperature, the more effective and faster the smoothing of the surface. The inert or reducing atmosphere to which the structure is exposed is preferentially composed of argon or a mixture of argon and hydrogen (for example, <1% hydrogen).

These heat treatments are advantageously carried out in large-sized furnaces that may contain a plurality of intermediate SOI structures 11.

The applicant has observed that certain SOI structures positioned in the vicinity of the injection of gas into the furnace have "haze" levels greater than the level obtained in the rest of the furnace. This is, in particular, true at the edges of the structures (illustrated in FIG. 1). These peripheral zones 100 of high residual roughness on the useful layer 10' are a problem for the final product for which the surface roughness and its uniformity at the surface of the SOI structure 11' are key parameters.

This residual roughness may be identified on the "haze" mappings (FIG. 1) and from maximum "haze" values measured on each SOI structure 11' after the smoothing treatment. FIG. 3 presents, on the y-axis, the maximum "haze" values measured on the structures positioned at various locations (x-axis) in the furnace. It clearly appears that the structures in positions 74 to 86 have a higher "haze" level compared to the other positions: in particular, a "haze" level greater than 0.17 (arbitrary units) is not compatible with the targeted applications.

The applicant has deduced from various tests that these zones 100 of residual roughness, preferably at the edges of the SOI structures, were due to the exposure of these edges to fresh gas comprising, even in a very small amount, contaminants (for example, $O_2$, $H_2O$, $CO_2$, etc.). Specifically, the presence of contaminants of this type disrupts the smoothing phenomenon by locally blocking the mobility of the silicon atoms at the surface. Peripheral zones 100 then remain on the treated useful layer 10', in which zones the roughness is greater than the expected level, which makes the final SOI structures 11' incompatible with the targeted applications.

The process for smoothing an SOI structure 11 according to the present disclosure comprises the exposure of the surface of the structure 11 to an inert or reducing gas flow and to a high temperature during a heat treatment. The process comprises a first step of heat treatment at a first temperature and under a first gas flow defined by a first flow rate. During this first step, a first smoothing of the surface of the surface layer 10 takes place along with a first dissolution of the underlying oxide layer 2. The first temperature is selected from a range of high temperatures, in particular between 1160° C. and 1200° C., and preferably between 1170° C. and 1200° C. This is thus in a thermal budget range where the surface smoothing is effective on a silicon surface layer. The first smoothing makes it possible to reduce the roughness, at the surface of the surface layer 10, over the entire range of spatial frequencies desired, from 0.1 nm to several microns, in a reasonably short time, that may range from 5 minutes at 1200° C. to around 2 hours at 1170° C.

As mentioned previously, within this range of high temperatures, a phenomenon of dissolution of the buried oxide layer 2 may occur. To avoid degrading the thickness uniformities of the surface layer 10 and dielectric layer 2, it is therefore important to maintain, during the smoothing annealing operation, a gas flow that is sufficient to evacuate the SiO volatile species formed by the dissolution phenomenon.

During this first step, the gas flow in the furnace is maintained at a high first flow rate, in order to avoid any accumulation of volatile species linked to the dissolution phenomenon of the oxide layer 2. Preferably, the first gas flow rate is greater than 20 slm (standard liters per minute). The dissolution phenomenon is thus homogeneous enough not to deteriorate the thickness uniformities of the surface layer 10 and buried oxide layer 2 to the point of making them incompatible with the targeted application.

This first heat treatment step of the smoothing process according to the disclosure makes it possible to eliminate a large portion of the roughness of the surface layer 10 and to achieve a good mean roughness level on all of the structures treated in the furnace. Nevertheless, there remain peripheral zones 100 of residual roughness, in particular on the SOI structures located in the vicinity of the injection of gases into the furnace. This local residual roughness makes the SOI structures incompatible with the expected specifications (the maximum "haze" values on these structures exceeding 0.17 (a.u.)).

The smoothing process according to the present disclosure therefore comprises a second heat treatment step at a second temperature lower than the first temperature and under a second gas flow defined by a second flow rate lower than the first flow rate. During this second step, a second smoothing of the surface of the surface layer 10 takes place. The second temperature is lower than the first temperature. In particular, the second temperature is chosen from a range of temperatures between 1130° C. and 1170° C., and preferably between 1130° C. and 1160° C. This is thus in a thermal budget range where the surface smoothing is still active but where the kinetics of the dissolution phenomenon are very slow. The phenomena of surface smoothing of the surface layer 10 and of dissolution of the buried oxide layer 2 are both thermally active, that is to say, that they are faster the higher the temperature. The smoothing phenomenon has thermal kinetics defined by the activation energy for the surface diffusion of the silicon atoms which is equal to 2 eV. The dissolution phenomenon has thermal kinetics defined by the activation energy for the diffusion of the oxygen atoms into the silicon which is equal to 4 eV. The dissolution is therefore much more sensitive to the temperature than the smoothing. Thus, during the second step of the process, at a temperature below 1170° C., and preferably below 1160° C., the dissolution is virtually zero (speed of the phenomenon is very low) whereas the smoothing remains significant, even though it has a lower effectiveness than at higher temperatures.

During this second step, the gas flow in the furnace is advantageously defined by a second low flow rate, in order to limit the amount of contaminants in contact with the surfaces of the SOI structures. Preferably, the second gas flow rate is less than 15 slm (standard liters per minute); advantageously, the second flow rate is of the order of 5 slm. The speed of dissolution being very low, the accumulation of SiO at the surface of the SOI structures 11 during this step is negligible and therefore there is no degradation of the thickness uniformities of the layers despite the low gas flow conditions.

The applicant has surprisingly observed that this second heat treatment step of the smoothing process according to the disclosure makes it possible to significantly lower the roughness level in the peripheral zones 100 of residual roughness, until it is made compatible with the expected specifications of the final product. The reduction in the amount of contaminants linked to the low gas flow rate (second flow) thus enables the smoothing phenomenon to take place with a good degree of effectiveness on the peripheral zones 100, despite a second temperature lower than the first temperature.

The first step and the second step are carried out respectively at a first temperature greater than a threshold temperature and at a second temperature lower than a threshold temperature. The threshold temperature is between 1150° C. and 1170° C., in the case of a silicon-on-insulator structure of which the thickness of the surface layer 10 is preferably between 200 nm and 500 nm. For thicknesses outside of this range, the threshold temperature could be substantially different, in particular due to the dependence of the dissolution phenomenon on the thickness of the surface layer 10.

In the case of other structures, comprising in particular a surface layer 10 of different nature (for example, SiGe, carbon-doped Si, etc.), the threshold temperature could be within a different temperature range, since it is dependent on the smoothing phenomenon (surface diffusion of the atoms) and dissolution phenomenon (diffusion of oxygen or oxide through the surface layer 10).

According to a first method of implementing the smoothing process according to the disclosure, the first heat treatment step and the second heat treatment step consist of two different annealing operations, between which the treated SOI structures 11 return to ambient temperature.

According to a second method of implementing the smoothing process according to the disclosure, the first heat treatment step and the second heat treatment step are linked together during the same annealing operation. According to a first variant, at the end of the first step, the temperature follows a decrease ramp that goes from the first temperature to the second temperature, for example, while maintaining the first gas flow. Alternatively, the gas flow could be gradually reduced during the decrease in temperature, until the second temperature is reached.

The second step then starts, under the second gas flow, with a hold at the second temperature, for a defined duration. The duration could vary for example from several minutes to several hours, in particular from 5 minutes to 2 hours.

According to one variant, the second step starts when the temperature changes from the first temperature to the second temperature. The gas flow then changes from the first flow to the second flow. The second step does not have a hold but takes place during the temperature decrease ramp, for example, of between 0.1°/minute and 20°/minute, starting from the second temperature.

The accumulation of volatile species (SiO) linked to the dissolution phenomenon is faster the thinner a thickness of the surface layer 10. The smoothing process according to the disclosure therefore is more advantageous the thinner the surface layer 10 of the SOI structure 11 and the more demanding the roughness and thickness uniformity specifications of the useful layer 10' and dielectric layer 2 of the final structure 11'. Preferably, the smoothing process according to the disclosure is advantageous for surface layers of less than 500 nm.

Two implementation examples will now be described, with reference to FIGS. 4 and 5.

Example 1

The smoothing process according to the disclosure is applied to intermediate SOI structures 11 comprising a 300 nm surface layer 10, a 30 nm buried oxide layer 2 and a carrier substrate 5.

The first heat treatment step and the second heat treatment step are linked together in the same annealing operation.

The first heat treatment step consists of an annealing for 135 minutes at 1175° C. (first temperature) under a first argon flow, the volumetric flow rate of which is 50 slm. The SOI structures 11 located in the top position in the furnace, that is to say in the vicinity of the injection of gas, have a high "haze" level, linked to the presence of peripheral zones 100 of residual roughness.

The graph from FIG. 4 presents, on the y-axis, the maximum "haze" value measured on each structure, the SOI structures 11 being located in various positions (on the x-axis) in the furnace. The dotted-line curve corresponds to the maximum "haze" values after an annealing equivalent to the first heat treatment step of the process. It may be observed that several structures, especially those in positions 85 to 110, have maximum "haze" values greater than 0.15-0.17 (a.u.), which makes them incompatible with the targeted application, the specification of which requires a maximum "haze" of less than 0.17.

When the hold at 1175° C. of the first step is completed, the temperature follows a descending ramp, under the first argon flow: the second heat treatment step of the smoothing process starts as soon as the temperature reaches 1160° C. (second temperature); the argon flow is then defined by a second volumetric flow rate of 5 slm. The second step in this case comprises a temperature decrease ramp starting from 1160° C. under the second gas flow.

At the outlet of the furnace, the treated SOI structures 11' have a "haze" level that is greatly improved relative to their state before the first heat treatment step; this improvement corresponds to the great reduction of the residual roughness in the peripheral zones 100, in particular for the SOI structures located in positions 70 to 110 in the furnace. The solid-line curve corresponds to the maximum "haze" level of the SOI structures treated with the smoothing process according to the present disclosure.

It is advantageously observed that the smoothing process according to the present disclosure reduces the roughness level over all of the SOI structures treated, bringing the maximum "haze" level down to values of less than 0.15 (a.u.).

Example 2

The smoothing process according to the present disclosure is applied to intermediate SOI structures 11 comprising a 300 nm surface layer 10, a 30 nm buried oxide layer 2 and a carrier substrate 5.

The first heat treatment step consists of an annealing for 5 minutes at 1200° C. (first temperature) under a first argon flow, the volumetric flow rate of which is 25 slm. The SOI structures located in the top positions in the furnace, that is to say in the vicinity of the injection of gas, have a high "haze" level, linked to the presence of peripheral zones 100 of residual roughness.

FIG. 5 presents, in the form of a box plot, the maximum "haze" values measured on each structure, the SOI structures being located in various positions in the furnace. The box on the left corresponds to the maximum "haze" values measured after an annealing corresponding to the first heat treatment step of the process. A high dispersion of these "haze" values within the range 0.18-0.24 (a.u.) can be observed, which makes the corresponding SOI structures incompatible with the targeted application, the specification of which requires a maximum "haze" of less than 0.17 (a.u.).

The second heat treatment step of the smoothing process according to the present disclosure consists of an annealing for 2 hours at 1160° C. (second temperature) under a second argon flow, the volumetric flow rate of which is 5 slm.

At the outlet of the furnace, the treated SOI structures 11' have a greatly improved "haze" level (corresponding to the great reduction of the residual roughness in the peripheral zones 100). The box on the right in FIG. 5 includes the maximum "haze" values measured on each SOI structure treated with the smoothing process according to the present disclosure. It is observed that all the values were lowered below 0.17 (a.u.), which is the expected maximum "haze" value for the targeted products. A very marked reduction in the dispersion of the maximum "haze" values is also observed: the smoothing process according to the present disclosure therefore clearly reduces the roughness level over all of the SOI structures treated.

The first heat treatment step and the second heat treatment step may be linked together in the same annealing operation or consist of two separate annealing operations.

Of course, the invention is not limited to the embodiments and examples described and embodiment variants may be introduced thereinto without departing from the scope of the invention as defined by the claims.

What is claimed is:

1. A method for smoothing a silicon-on-insulator structure comprising the exposure of a surface of the structure to an inert or reducing gas flow and to a high temperature during a heat treatment, the method comprising:
    a first heat treatment step at a first temperature greater than a threshold temperature which is between 1150° C. and 1170° C., and under a first gas flow defined by a first flow rate greater than 20 slm; and
    a second heat treatment step at a second temperature lower than the first temperature and the threshold temperature and greater than 1130° C., and under a second gas flow defined by a second flow rate lower than the first flow rate and less than 15 slm.

2. The method of claim 1, further comprising a preliminary step of supplying the SOI structure comprising a thin surface layer positioned on a dielectric layer, the dielectric layer positioned on a carrier substrate, the surface layer having a thickness of less than 500 nm.

3. The method of claim 1, wherein the first temperature is between 1160° C. and 1200° C.

4. The method of claim 3, wherein the first temperature is between 1170° C. and 1200° C.

5. The method of claim 1, wherein the second temperature is between 1130° C. and 1160° C.

6. The method of claim 1, wherein the second heat treatment step comprises a hold at the second temperature of a given duration.

7. The method of claim 6, wherein the duration of the hold is between 5 minutes and 2 hours.

8. The method of claim 1, wherein the second heat treatment step comprises a temperature decrease ramp, starting from the second temperature, at a decrease ramp rate of between 0.1°/minute and 20°/minute.

9. The method of claim 1, wherein the second flow rate is about 5 slm.

10. The method of claim 9, wherein the inert gas is selected from argon or a mixture of argon and hydrogen.

11. The method of claim 1, wherein the first heat treatment step and second heat treatment step are linked together during the same heat treatment.

12. The method of claim 1, wherein the first temperature is greater than a threshold temperature and the second temperature is lower than the threshold temperature, the threshold temperature being between 1150° C. and 1170° C.

13. The method of claim 1, wherein the second temperature is between 1130° C. and 1170° C.

14. The method of claim 1, wherein the second heat treatment step comprises a hold at the second temperature of a given duration.

15. The method of claim 1, wherein the first flow rate is greater than 20 slm, and wherein the second flow rate is less than 15 slm.

16. The method of claim 1, wherein the inert gas is selected from argon or a mixture of argon and hydrogen.

17. The method of claim 1, wherein the first heat treatment step and second heat treatment step are linked together during the same heat treatment.

18. The method of claim 1, wherein the surface of the structure is smoothened and dissolution of an insulator layer occurs during the first heat treatment.

\* \* \* \* \*